United States Patent
Huang et al.

(10) Patent No.: US 7,081,777 B2
(45) Date of Patent: *Jul. 25, 2006

(54) MULTIPLE-PHASE SWITCHING CIRCUIT

(75) Inventors: Chen-Chih Huang, Hsinchu (TW); Pao-Cheng Chiu, HsinTien (TW)

(73) Assignee: Realtek Semiconductor Corp. (TW)

( * ) Notice: Subject to any disclaimer, the term of this patent is extended or adjusted under 35 U.S.C. 154(b) by 4 days.

This patent is subject to a terminal disclaimer.

(21) Appl. No.: 10/915,874

(22) Filed: Aug. 10, 2004

(65) Prior Publication Data

US 2005/0012539 A1      Jan. 20, 2005

Related U.S. Application Data

(63) Continuation-in-part of application No. 10/156,341, filed on May 28, 2002, now Pat. No. 6,803,796.

(51) Int. Cl.
*H03K 17/00*    (2006.01)

(52) U.S. Cl. .................................. 327/99; 327/298
(58) Field of Classification Search ............... None
See application file for complete search history.

(56) References Cited

U.S. PATENT DOCUMENTS

| | | | |
|---|---|---|---|
| 5,483,185 A | 1/1996 | Scriber et al. | 327/99 |
| 5,623,223 A | 4/1997 | Pasqualini | 327/298 |
| 6,075,392 A | 6/2000 | Sandner | 327/145 |
| 6,121,816 A | 9/2000 | Tonks et al. | 327/296 |
| 6,127,858 A | 10/2000 | Stinson et al. | 327/99 |
| 6,452,426 B1 | 9/2002 | Tamarapalli et al. | 327/99 |

*Primary Examiner*—Timothy P. Callahan
*Assistant Examiner*—Cassandra Cox

(57) ABSTRACT

A multiple-phase switching circuit includes an alternative signal generator for generating a plurality of alternative signals according to a switching signal, and a multiplexer for receiving a plurality of clock signals and outputting a target clock signal according to the alternative signals. Only one of the alternative signals generated by the alternative signal generator is in a first logic level, while the other alternative signals are in a second logic level. The alternative signal generator changes the logic level of a first alternative signal having the first logic level into the second logic level, and changes the logic level of a second alternative signal adjacent to the first alternative signal into the first logic level.

20 Claims, 14 Drawing Sheets

MULTIPLE-PHASE SWITCHING CIRCUIT

This is a continuation-in-part of U.S. patent application Ser. No. 10/156,341, filed on May 28, 2002 now U.S. Pat. No. 6,803,796, whose content is hereby incorporated by reference.

BACKGROUND OF THE INVENTION

1. Field of the Invention

The present invention relates to a phase switching circuit, and more particularly, to a multiple-phase switching circuit capable of switching bi-directionally.

2. Description of the Related Art

In a data recovery system, received high-frequency signal, which is declined by noise, can be recovered by circuit components such as an equalizer. However, correct sampling of data stream still strongly depends on precise control of clock signal. Alignment of the rising and/or falling edges of the clock signal to the middle of each bit data of the data stream is desired, in order to ensure correct sampling. Conventionally, a continuous time phase locked loop (PLL) is employed in a data recovery system to achieve the aforementioned alignment. However, data recovery using the continuous time PLL suffers from longer lock time, phase noise, as well as single receiving channel.

Consequently, multiple-phase system is adapted to embodying the clock recovery system. The alignment of the rising/falling edges of the clock signal to the data stream can be achieved by selecting among multiple-phase signals a proper phase signal in the multiple-phase system. Faster lock-in time can be expected using multiple-phase system. The influence of noise can also be minimized due to mostly digitized operations. Moreover, the multiple-phase clock signals enable multiple receiving channel applications.

FIG. 1A shows a clock recovery system employing a multiple-phase switching circuit. The received data stream and the system clock are inputted and processed by a digital signal processor (DSP) 10 to obtain the timing information between the data stream and the clock in determining whether the clock leads ahead or lags behind the desired sampling point. An up/down signal is then sent to a multiple-phase switching circuit 11 to accordingly select a recovery clock from a plurality of clock signals with different phases as the system clock. Such selected system clock is utilized as the sampling clock of the received data stream.

FIG. 1B shows a timing diagram of the data stream and the plurality of clock signals (CK0–CK7) with different phases. As shown in FIG. 1B, the most suitable clock signal for data sampling is the clock signal CK4 whose rising edges are aligned to the desired middle point of each bit data of the data stream. As a result, if in the first place the system clock is selected to be CK2, as shown in FIG. 1C, the DSP 10 will control the multiple-phase switching circuit 11 to sequentially switch through CK3 to CK4, also shown in FIG. 1C, and eventually locks the system clock at CK4. However, the smooth switching procedure shown in FIG. 1C is the ideal case, while FIG. 1D illustrates a more realistic situation, wherein undesirable glitch and/or spike phenomenon 13 can be seen when switching between clock signals with different phases occurs. In order to avoid such glitch/spike phenomenon, conventionally single direction phase switching (either upwards or downwards) is employed, which, however, in turn increases the average lock-in time.

The multiple-phase switching circuit can also be employed in a frequency synthesizer as shown in FIG. 2B, in the stead of a conventional frequency synthesizer utilizing a pulse swallower 24, as shown in FIG. 2A, which is well known to those skilled in the art. Referring to FIG. 3, by employing the conventional frequency synthesizer in FIG. 2A, a signal with frequency $f_0=f_1-1/Tp$, which in this particular case can be a non-integer multiple of $f_1=1/Ts$ in FIG. 3(a), can be synthesized with pulse swallowing, as shown in FIG. 3(b). However, larger clock jitter tends to be induced through direct pulse swallowing. Such jitter phenomenon may be minimized by adopting the frequency synthesizer utilizing a multiple-phase switching circuit 21 as shown in FIG. 2B. A multiple-phase voltage controlled oscillator 25 generating a plurality of clock signals with different phases, as well as the multiple-phase switching circuit 21, whose operation is similar to the multiple-phase switching circuit 11 in the data recovery system, are utilized in the frequency synthesizer to synthesize the signal with frequency $f_0=f_1-1/Tp$, by "gradually" switching the outputted signal of the multiple-phase switching circuit 21 through clock signals with different phases, as shown in FIG. 3(c). As such, jitter caused by pulse swallowing can be significantly reduced.

SUMMARY OF THE INVENTION

It is therefore one of the many objectives to provide multiple-phase switching circuit capable of switching bi-directionally among signals with different phases.

According to embodiments of the present invention, a multiple-phase switching circuit is disclosed. The multiple-phase switching circuit comprises an alternative signal generator for generating a plurality of alternative signals according to a switching signal; a multiplexer coupled to the alternative signal generator, for receiving a plurality of clock signals and outputting a target clock signal according to the alternative signals; wherein only one of the alternative signals generated by the alternative signal generator is in a first logic level, while the other alternative signals are in a second logic level.

According to embodiments of the present invention, a multiple-phase switching circuit is also disclosed. The multiple-phase switching circuit comprises an alternative signal generator for generating a plurality of according to a switching signal; a multiplexer coupled to the alternative signal generator, for receiving a plurality of clock signals and outputting a target clock signal according to the alternative signals; wherein the alternative signal generator changes the logic level of a first alternative signal of the alternative signals having a first logic level into a second logic level, and changes the logic level of a second alternative signal of the alternative signals adjacent to the first alternative signal into the first logic level.

These and other objectives of the present invention will no doubt become obvious to those of ordinary skill in the art after reading the following detailed description of the embodiments that is illustrated in the various figures and drawings.

DETAILED DESCRIPTION OF THE EMBODIMENTS

Figure 1A:
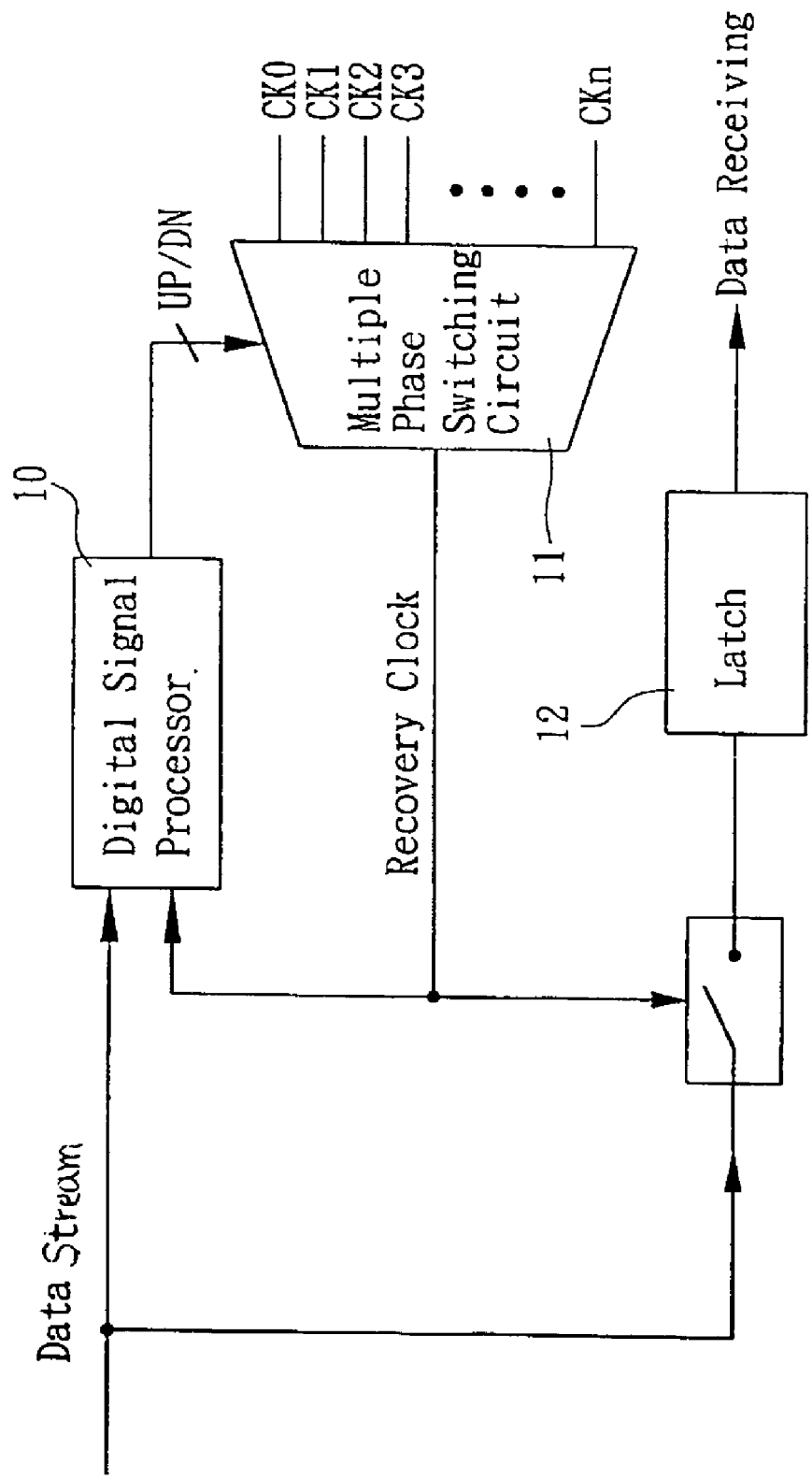
FIG. 1A shows a diagram of a conventional clock recovery system that employing a multiple-phase system.
Figure 1B:
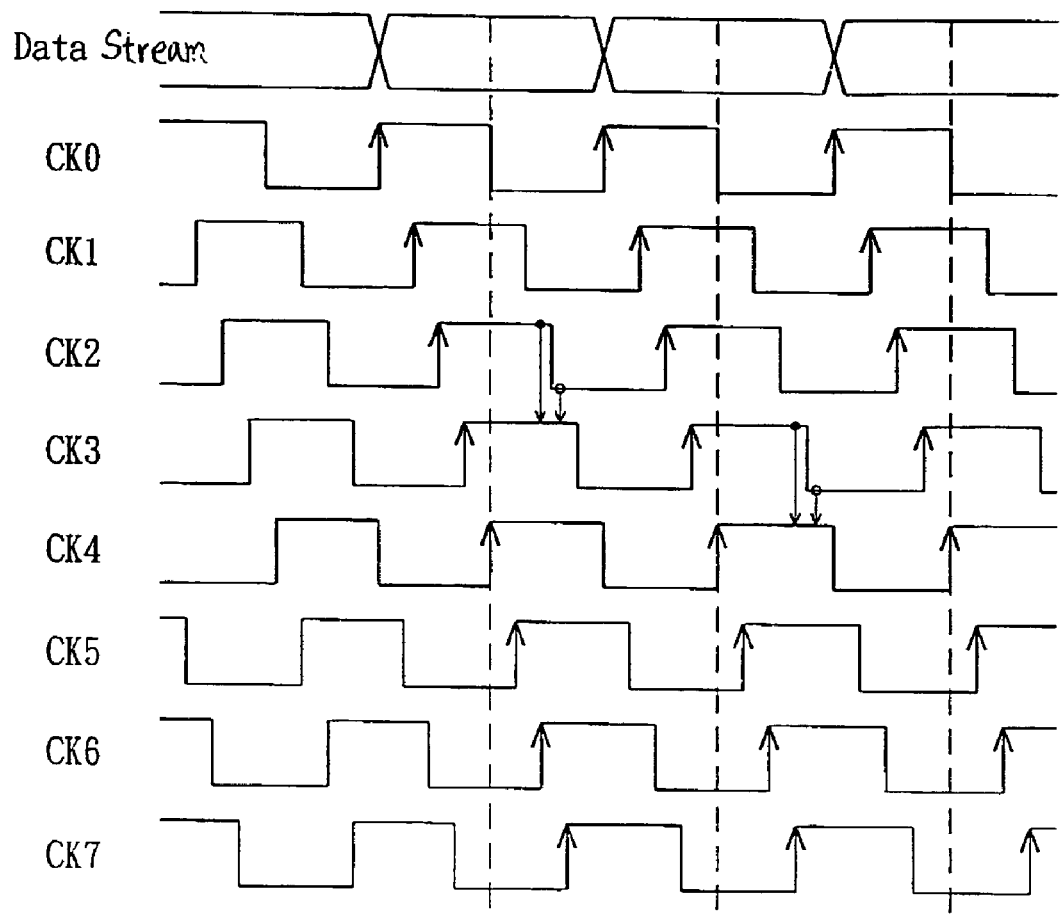
FIG. 1B, 1C, and 1D show timing diagrams of the clock signals shown in FIG. 1A.
Figure 1C:
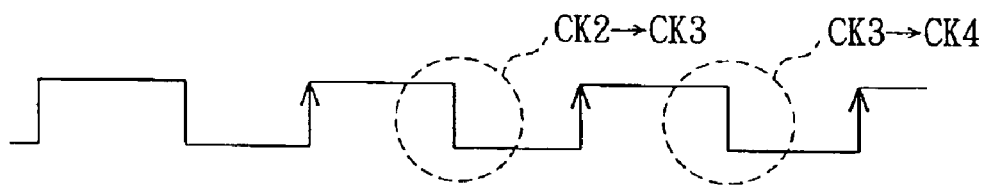
Figure 1D:
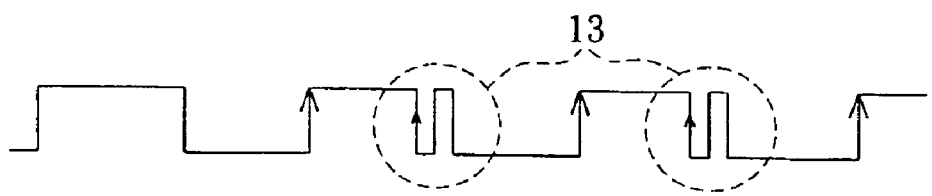
Figure 2A:
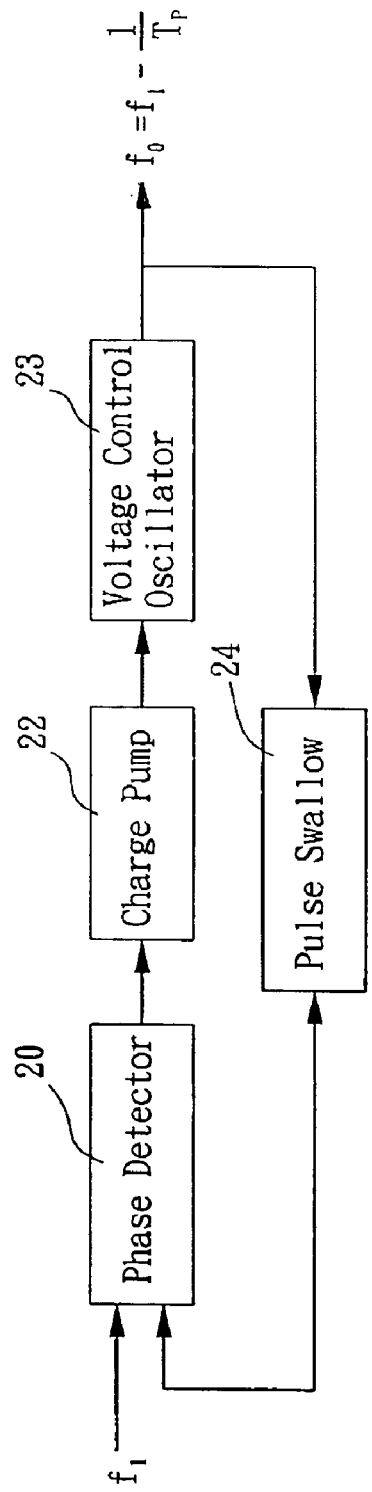
FIG. 2A shows a diagram of a conventional frequency synthesizer.
Figure 2B:
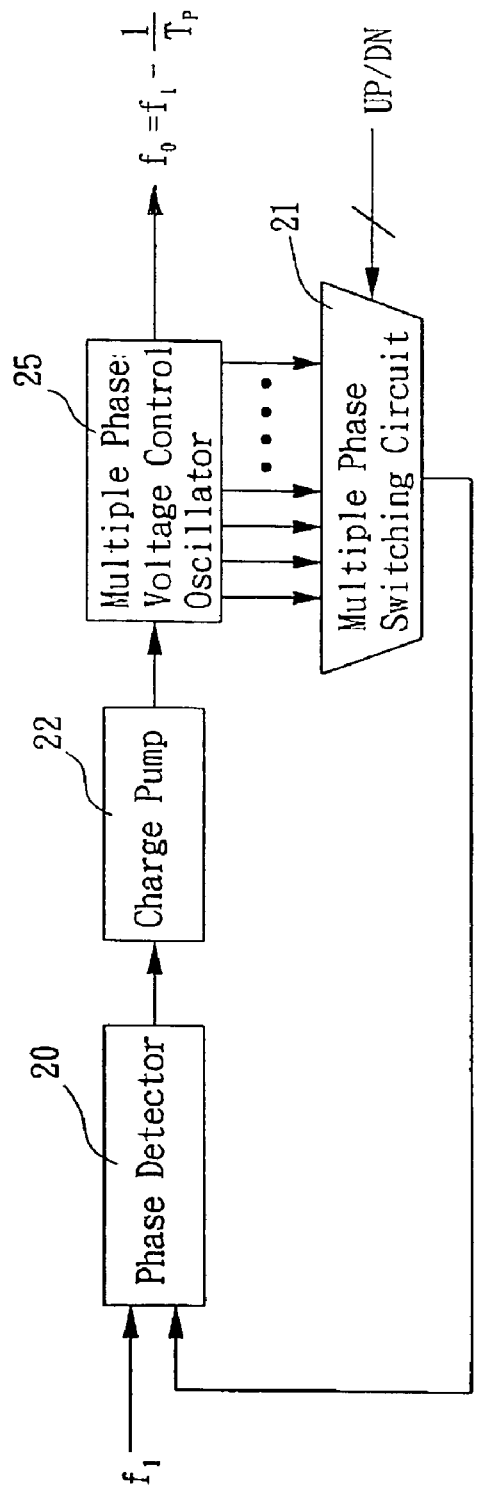
FIG. 2B shows a diagram of a frequency synthesizer that employing a multiple-phase switching circuit.
Figure 3:
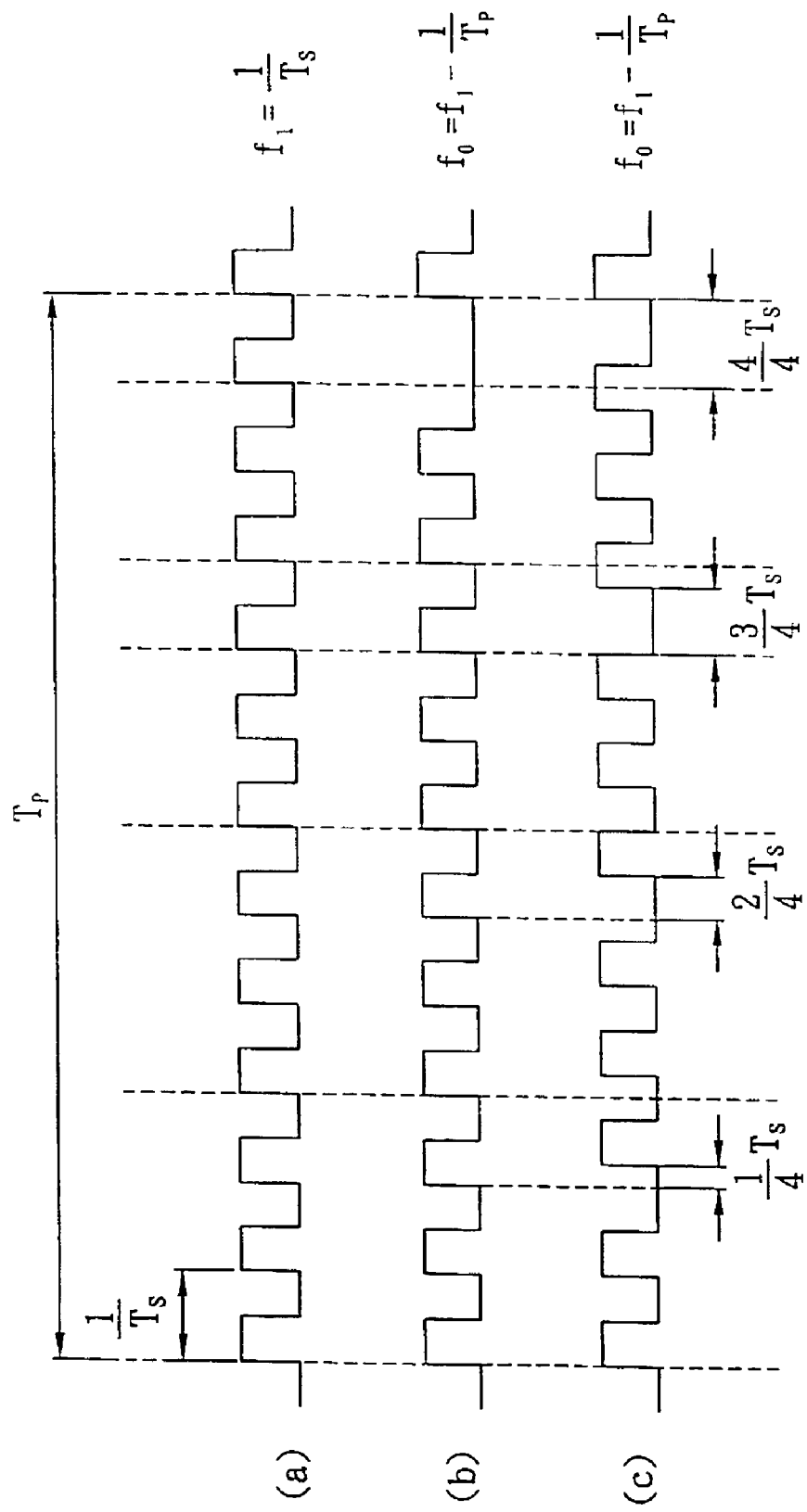
FIG. 3 shows a timing diagram of the clock signals shown in FIG. 2A and FIG. 2B.
Figure 4A:
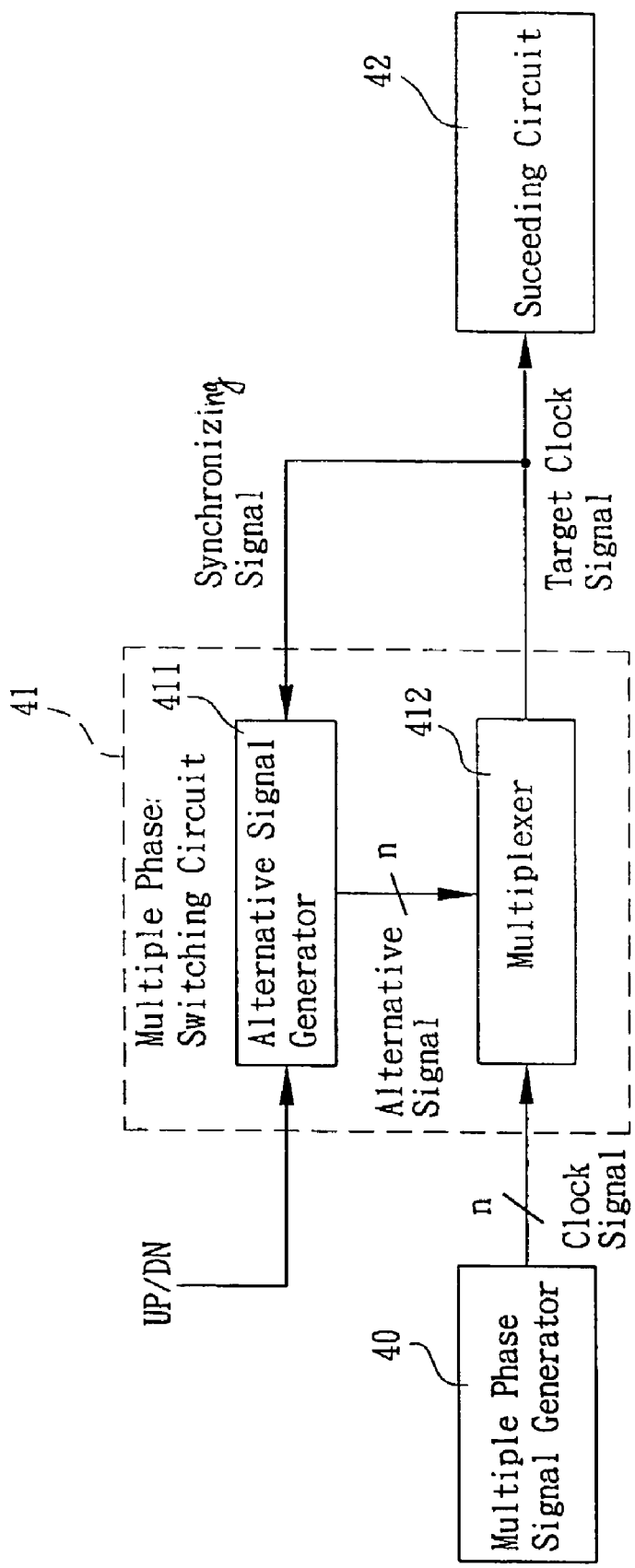
FIG. 4A shows a block diagram of a multiple-phase switching circuit according to an embodiment of the present invention.

FIG. 4A shows a block diagram of a block diagram of a multiple-phase switching circuit 41 according to an embodiment of the present invention. The multiple-phase switching circuit 41 receives a plurality of clock signals with different phases generated by a multiple-phase signal generator 40, and selects from among the plurality of clock signals a target clock signal according to an UP/DN control signal, which may be generated by a DSP and is well known to those skilled in the art, for the use of a succeeding circuit 42. The multiple-phase switching circuit 41 comprises an alternative signal generator 411 and a multiplexer 412. The alternative signal generator 411 generates n alternative signals according to the UP/DN signal, wherein in this embodiment only one of the n alternative signals is with logical "1", while the rest of the signals are with logical "0". In this embodiment, the alternative signal generator is controlled by the UP/DN signal to change the state of the signal adjacent to the logical "1" alternative signal to logical "1". Moreover, the alternative signal generator 411 is triggered (i.e., synchronized) by a synchronizing signal, to output the n alternative signals. The multiplexer 412 then receives the n clock signals from the multiple-phase signal generator 40 and the n alternative signals, and outputs the clock signal corresponding to the logical "1" alternative signal as the target clock signal. In this embodiment, the target clock signal is fed back to the alternative signal generator 411 as the synchronizing signal. As is well known to those skilled in the art, the multiple-phase switching circuit can be adopted into a data recovery system, a frequency synthesizer, or the like.

Figure 4B:
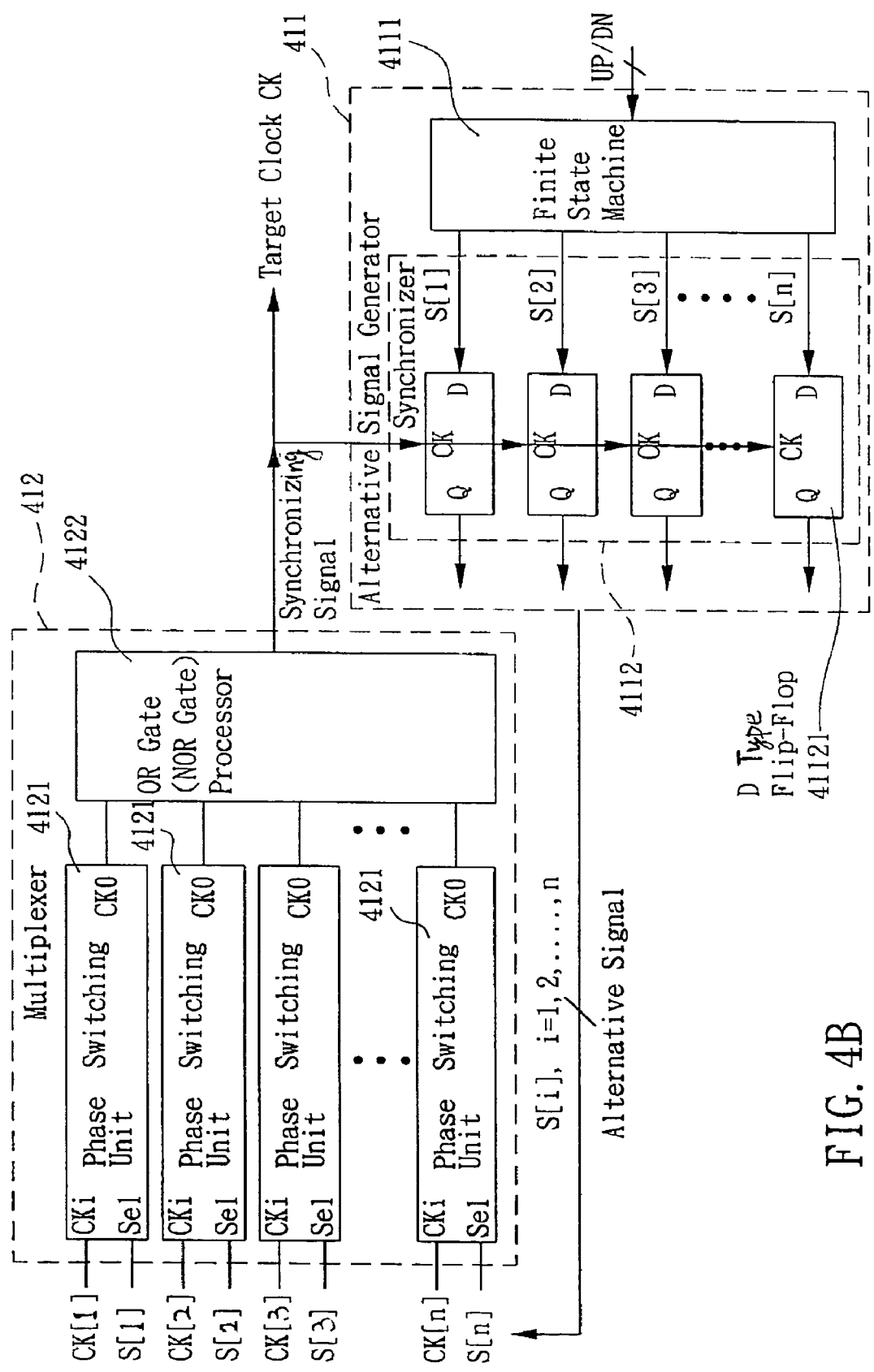
FIG. 4B shows a detailed block diagram of the multiple-phase switching circuit of FIG. 4A according to an embodiment of the present invention.

Please refer to FIG. 4B. FIG. 4B shows a detailed block diagram of the multiple-phase switching circuit of FIG. 4A according to an embodiment of the present invention. In FIG. 4B, the alternative signal generator 411 comprises a finite state machine 4111 and a synchronizer 4112. The finite state machine 4111 generates the n alternative signals S[1:n], one of which is with logical "1" and the rest with logical "0", according to the UP/DN signal. The synchronizer 4112 comprises n D type flip-flops, which is triggered by the synchronizing signal, for synchronously outputting the n alternative signals S[1:n] from the finite state machine 4111.

The multiplexer 412 comprises n phase switching units 4121 and an OR gate (in other embodiments, NOR gate) processor 4122. Each phase switching unit 4121 receives one of the clock signals CK[1]–CK[n] and a corresponding one of the alternative signals S[1]–S[n], and proceeds a glitch/spike-free process to generate an output signal to the OR gate processor 4122. Each phase switching unit 4121 determines whether to pass the received clock signal CK[i] or not, according to the received alternative signal S[i]. The OR gate processor 4122 then processes OR operation on the n output signals from the n phase switching units 4121 and outputs the result as the target clock signal CK. The OR gate can be realized by a combination of various logic gates, which is well known to those skilled in the art.

Figure 4C:
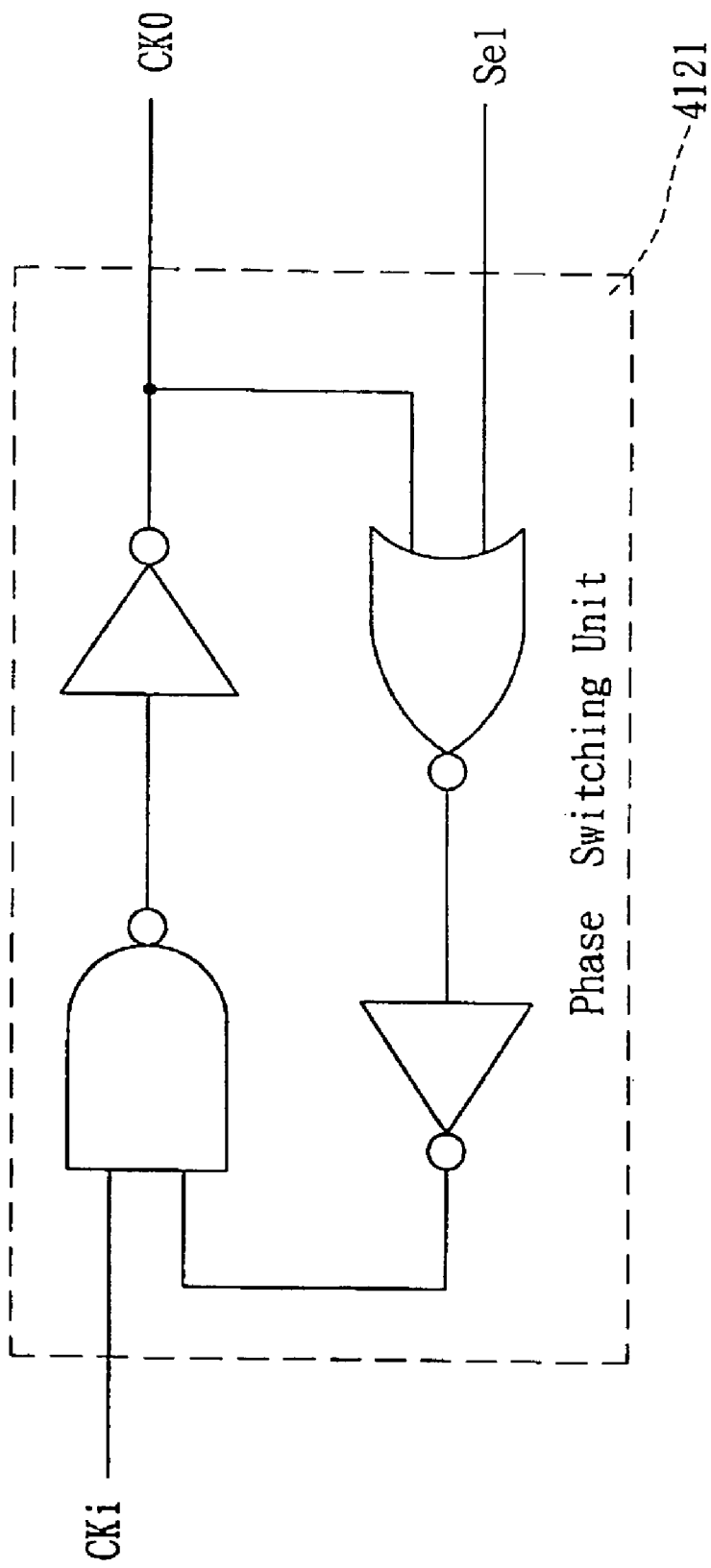
FIG. 4C shows a gate-level diagram of the phase switching unit in FIG. 4B according to an embodiment of the present invention.

FIG. 4C shows a gate-level diagram of the phase switching unit in FIG. 4B according to an embodiment of the present invention. According to FIG. 4C, the logic can be summarized as follows:

when (Sel=1)=>CKo=CKi, when (Sel=0 & CKi=0)=>CKo=0

Figure 5A:
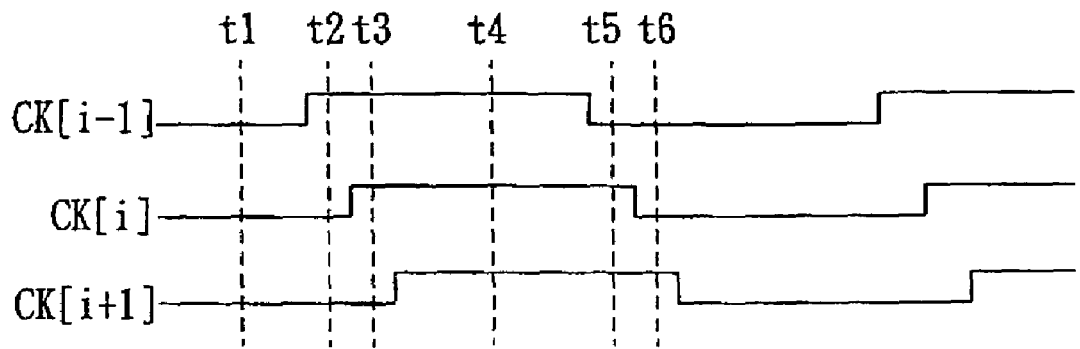
FIG. 5A, 5B, and 5C show timing diagrams of the signals shown in FIG. 4B according to an embodiment of the present invention.
Figure 5B:
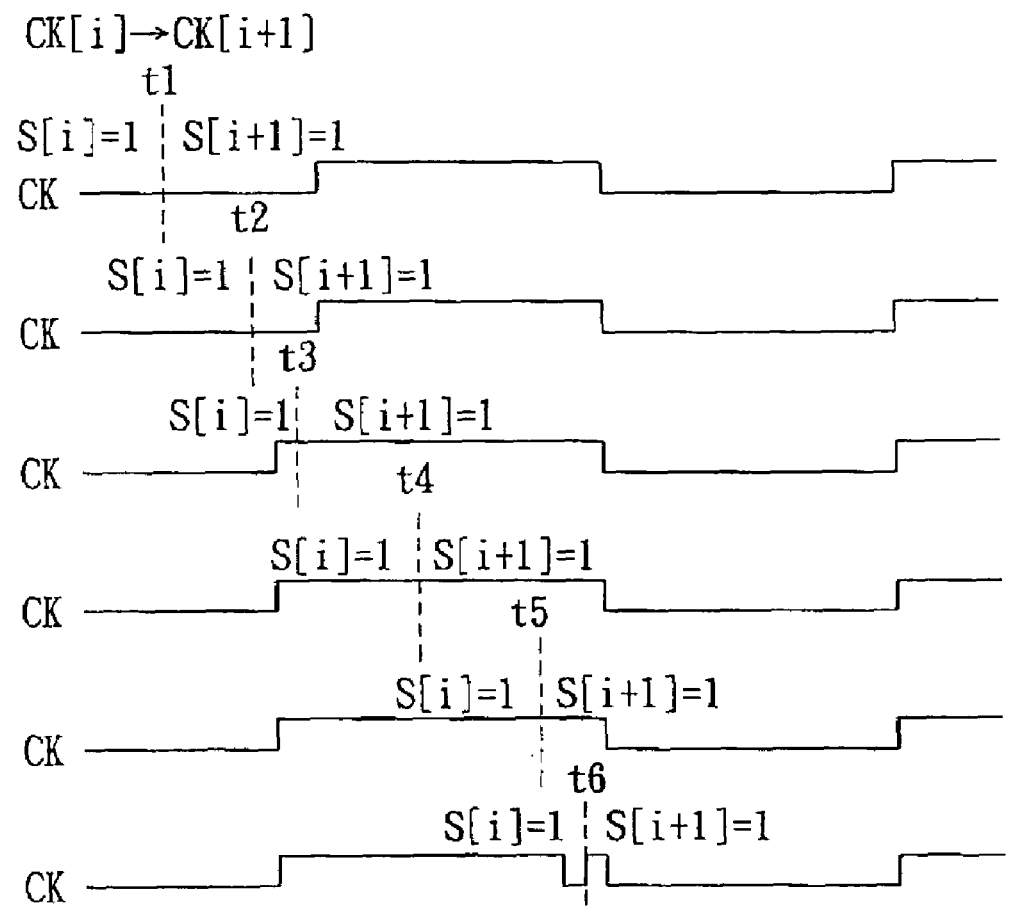
Figure 5C:
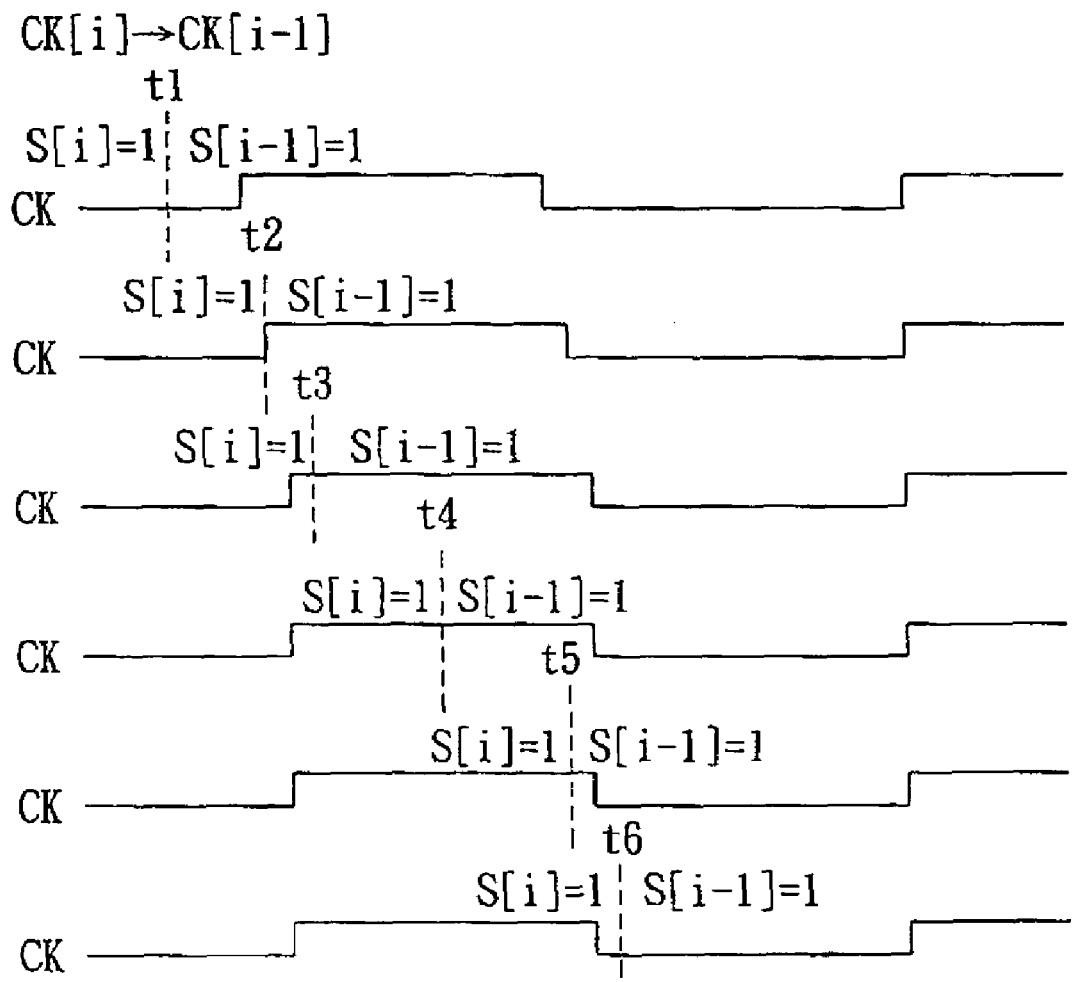

That is, when the alternative signal S[i] is logical "1", the clock signal CK[i] is passed to the output signal CKo, whereas when the alternative signal S[i] is logical "0" and the clock signal CK[i] is logical "0", the output signal CKo is set to be logical "0". Please now refer to FIG. 5, which shows timing diagrams of the target clock signal CK when switching among the plurality of clock signals utilizing the phase switching unit 4121 in FIG. 4C. FIG. 5A shows three adjacent clock signals CK[i−1], CK[i], CK[i+1] with timing markings t1 to t6 indicating possible time of switching. With the reference of the three adjacent clock signals shown in FIG. 5A, FIG. 5B shows the resulted target clock signal CK outputted from the OR gate processor 4122 when the switching from CK[i] to CK[i+1] occurs at time t1 through t6, respectively. Similarly, FIG. 5C shows the resulted target clock signal CK outputted from the OR gate processor 4122 when the switching from CK[i] to CK[i−1] occurs at time t1 through t6, respectively. It is to be noted that the only situation in which glitch/spike appears is when the switching from CK[i] to CK[i+1] occurs at time t6, and this can be avoided by taking the advantage of inherent circuit delay to avoid the switching from happening during such period, since the alternative signals have been synchronized by the target clock signal CK. In other words, the introduction of the synchronizer 4112 triggered by the target clock signal CK contributes to the glitch/spike-free characteristic of the multiple-phase switching circuit in this embodiment.

As being made obvious through the above description, the multiple-phase switching circuit in this embodiment of the invention is capable of switching forward/backward (i.e., bi-directionally) among clock signals with different phases and outputting a target clock signal free of glitch/spike. The 50% duty cycle of the resulted target clock signal may be maintained by properly adjusting the aspect ratio of devices.

Figure 6A:
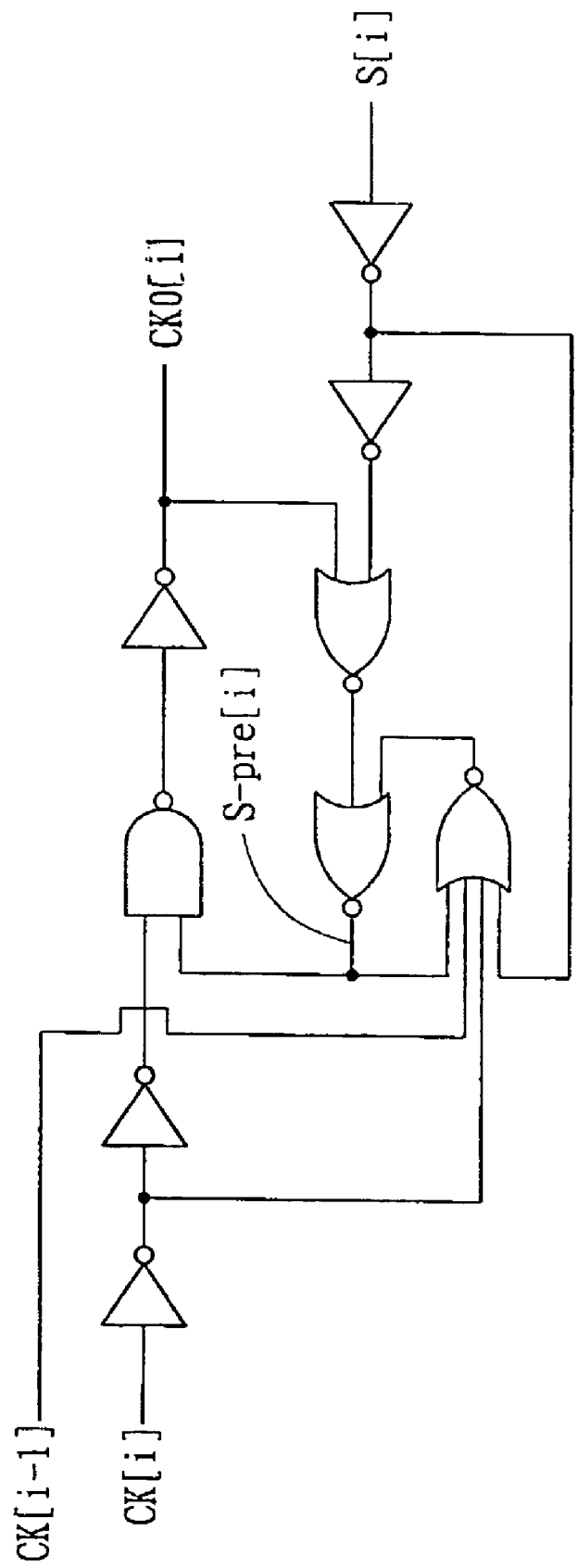
FIG. 6A shows a gate-level diagram of the phase switching unit in FIG. 4B according to another embodiment of the present invention.
Figure 7A:
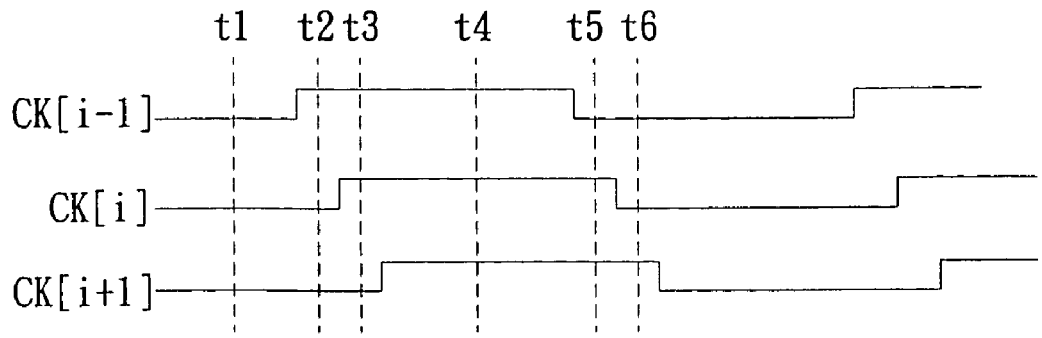
FIG. 7A, 7B, and 7C show timing diagrams of the signals shown in FIG. 6B according to an embodiment of the present invention.
Figure 7B:
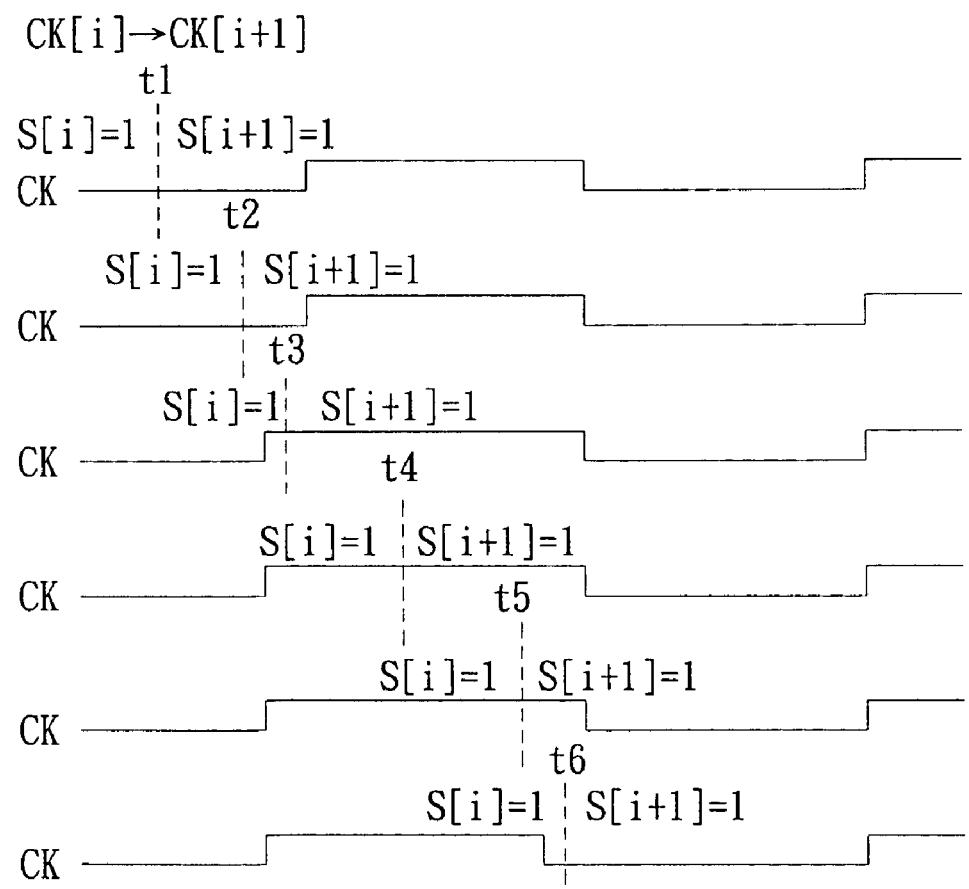
Figure 7C:
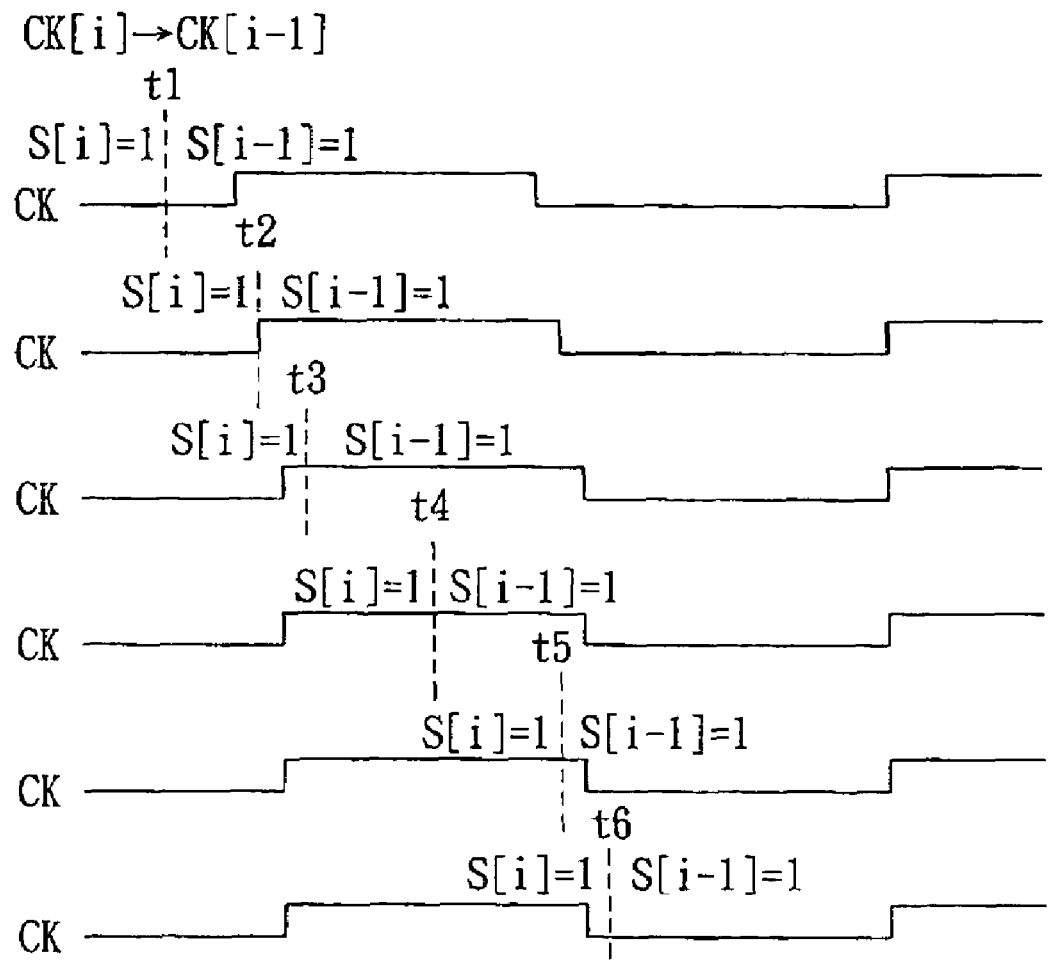

FIG. 6A shows a gate-level diagram of the phase switching unit according to another embodiment of the present invention. The phase switching unit in FIG. 6A passes the clock signal CK[i] according not only to the alternative signal S[i], but also to the adjacent clock signal CK[i−1], and therefore is implemented in conjunction with the multiple-phase switching circuit shown in FIG. 6B, which is another embodiment of the present invention. According to FIG. 6A, the logic can be summarized as follows:

when (S[i]=1 & S_pre[i]=0)=> if !(CK[i]=1 & CK[i−1]=0), then CKo[i]=CK[i]

when (S[i]=0 & CK[i]=0)=>CKo[i]=0 wherein S_pre[i] is the previous state of the alternative signal S[i]. That is, when the alternative signal S[i] is logical "0" and the clock signal CK[i] is logical "0", the output signal CKo[i] is set to be logical "0", whereas when the previous state of the alternative signal S_pre[i] is logical "0" and the current alternative signal S[i] is logical "1", if it is not true that CK[i] is logical "1" and CK[i−1] is logical "0", then the clock signal CK[i] is passed to the output signal CKo[i]. Please now refer to FIG. 7, which shows timing diagrams of the target clock signal CK when switching among the plurality of clock signals utilizing the phase switching unit 4121 in FIG. 6A. FIG. 7A shows three adjacent clock signals CK[i−1], CK[i], CK[i+1] with timing markings t1 to t6 indicating possible time of switching. With the reference of the three adjacent clock signals shown in FIG. 7A, FIG. 7B shows the resulted target clock signal CK outputted from the OR gate processor 4122 when the switching from CK[i] to CK[i+1] occurs at time t1 through t6, respectively. Similarly, FIG. 7C shows the resulted target clock signal CK outputted from the OR gate processor 4122 when the switching from CK[i] to CK[i−1] occurs at time t1 through t6, respectively. It is to be noted from FIG. 7 that, by adopting the reference to the adjacent clock signal CK[i−1], in addition to the alternative signal S[i], in generating the output signal CKo[i] of the phase switching unit 4121, the glitch/spike phenomenon can be entirely eliminated.

Figure 6B:
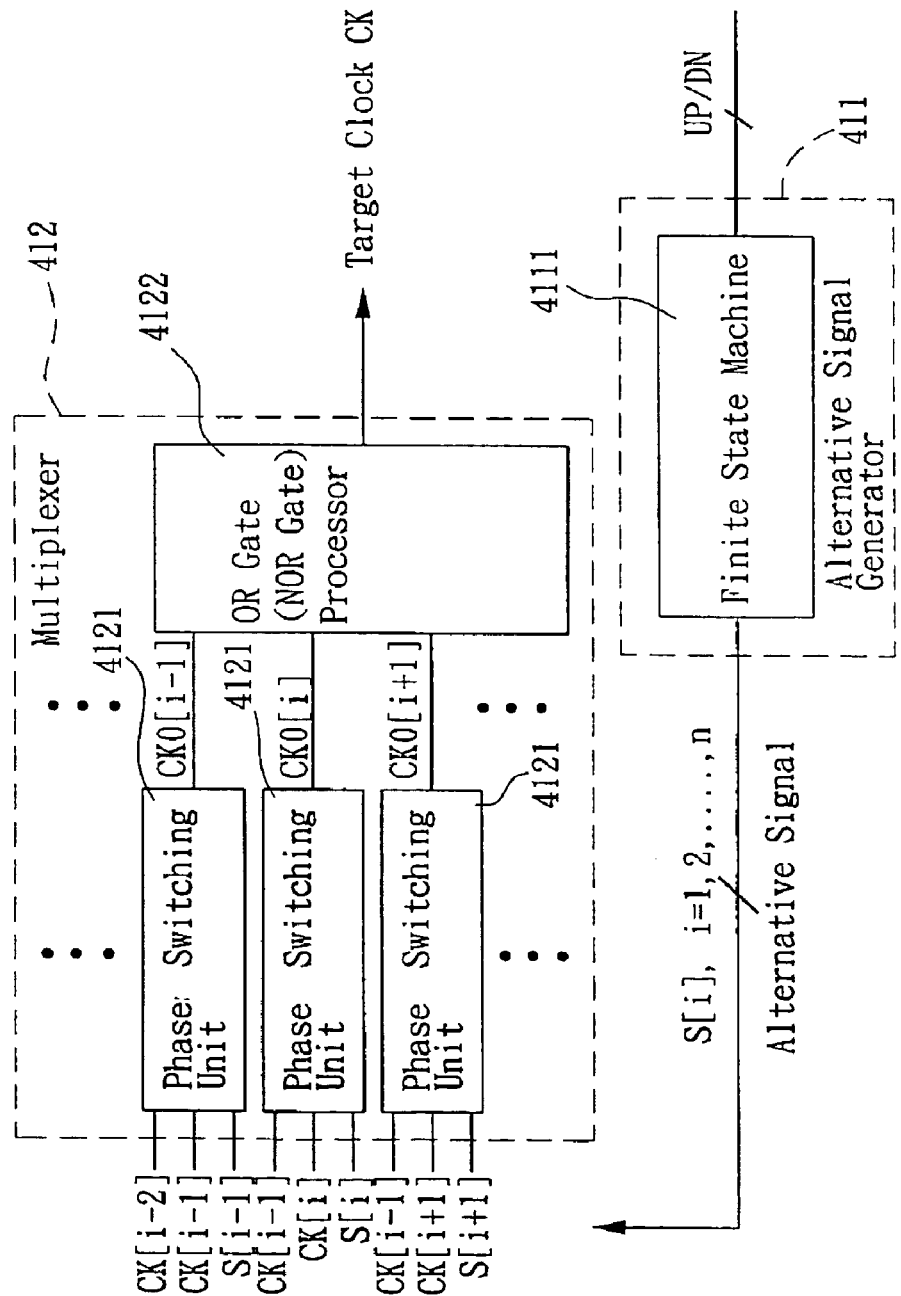
FIG. 6B shows a detailed block diagram of the multiple-phase switching circuit of FIG. 4A according to another embodiment of the present invention.

It is to be noted that the multiple-phase switching circuit in FIG. 6B differs, among other aspects, from the multiple-phase switching circuit in FIG. 4A in that the alternative signals generated by the finite state machine 4111 are not synchronized by the target clock signal CK, since the glitch/spike-free characteristic of the multiple-phase switching circuit in this embodiment can be achieved by the adoption of the phase switching unit referencing the adjacent clock signal CK[i−1] in FIG. 6A.

Figure 8:
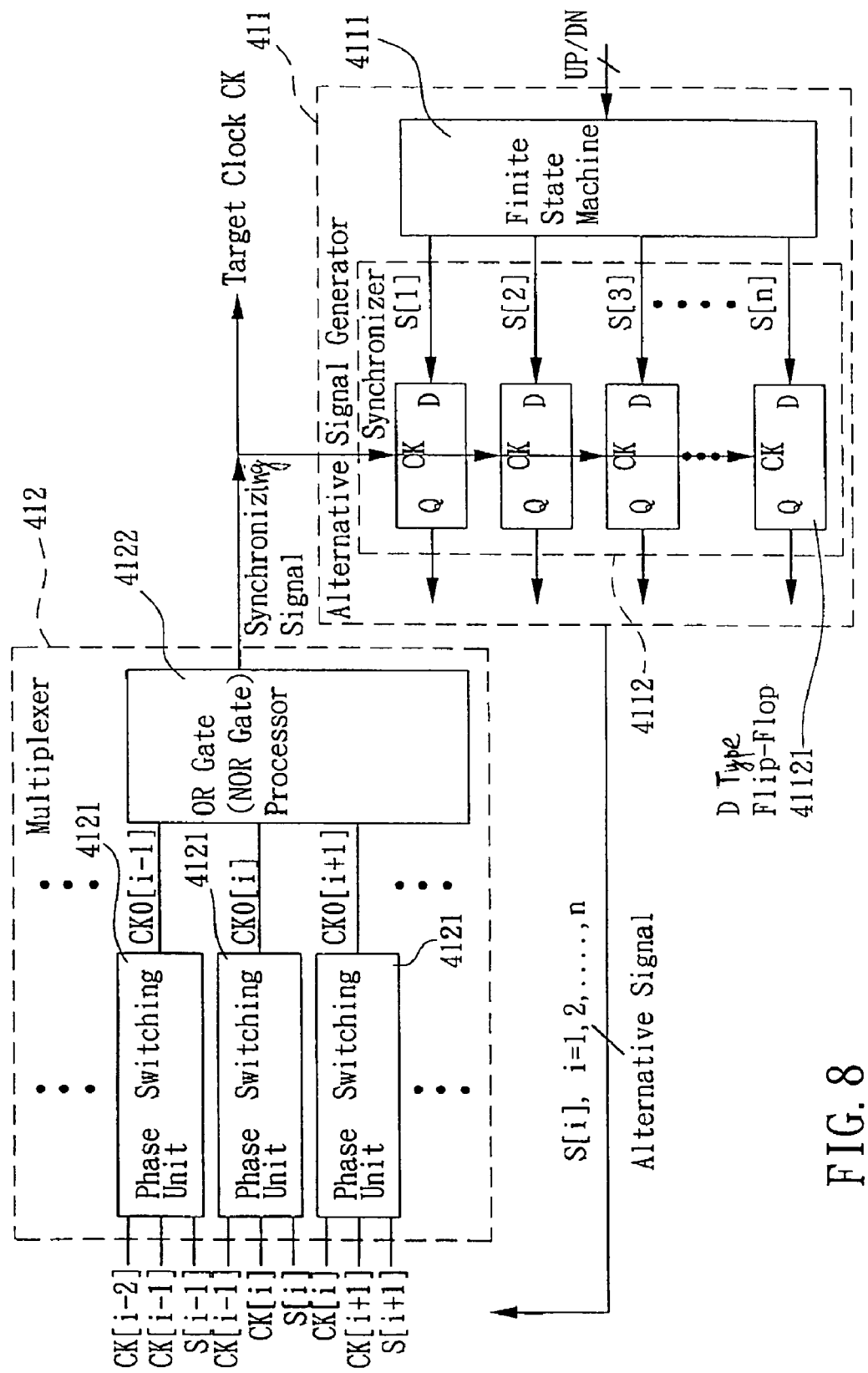
FIG. 8 shows a detailed block diagram of the multiple-phase switching circuit of FIG. 4A according to yet another embodiment of the present invention.

Of course, a multiple-phase switching circuit incorporating a synchronizer 41121 triggered by the target clock signal CK as a synchronizing signal thereof, as well as a plurality of phase switching units 4121 referencing the adjacent clock signal, can also be implemented, which is shown in FIG. 8 as yet another embodiment of the present invention.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A multiple-phase switching circuit comprising:
   an alternative signal generator for generating a plurality of alternative signals according to a switching signal;
   a multiplexer coupled to the alternative signal generator, for receiving a plurality of clock signals and outputting a target clock signal according to the alternative signals;
   wherein only one of the alternative signals generated by the alternative signal generator is in a first logic level, while the other alternative signals are in a second logic level.

2. The multiple-phase switching circuit of claim 1 wherein the alternative signal generator comprises:
   a finite state machine for generating the plurality of alternative signals according to the switching signal; and
   a synchronizer coupled to the finite state machine, for receiving the alternative signals and synchronously outputting the alternative signals.

3. The multiple-phase switching circuit of claim 2 wherein the synchronizer synchronously outputs the alternative signals according to the target clock signal.

4. The multiple-phase switching circuit of claim 2 wherein the synchronizer comprises a plurality of D-type flip-flops.

5. The multiple-phase switching circuit of claim 1 wherein the multiplexer comprises:
   a plurality of phase switching units for receiving the plurality of input clock signals and outputting a plurality of output signals according to the alternative signals; and
   a gate processor coupled to the phase switching units, for receiving the output signals and outputting the target clock signal.

6. The multiple-phase switching circuit of claim 5 wherein each phase switching unit receives one of the alternative signals and at least one of the clock signals.

7. The multiple-phase switching circuit of claim 5 wherein the gate processor is either an OR gate processor or a NOR gate processor.

8. The multiple-phase switching circuit of claim 1 wherein the alternative signal generator changes the logic level of a first alternative signal of the alternative signals having the first logic level into the second logic level, and changes the logic level of a second alternative signal of the alternative signals adjacent to the first alternative signal into the first logic level.

9. The multiple-phase switching circuit of claim 8 wherein each clock signal corresponds to one of the alternative signals, and the multiplexer outputs the clock signal corresponding to the second alternative signal as the target clock signal.

10. The multiple-phase switching circuit of claim 1 wherein the multiple-phase switching circuit is used in a data recovery system or in a frequency synthesizer.

11. A multiple-phase switching circuit comprising:
    an alternative signal generator for generating a plurality of alternative signals according to a switching signal;
    a multiplexer coupled to the alternative signal generator, for receiving a plurality of clock signals and outputting a target clock signal according to the alternative signals;
    wherein the alternative signal generator changes the logic level of a first alternative signal of the alternative signals having a first logic level into a second logic level, and changes the logic level of a second alternative signal of the alternative signals adjacent to the first alternative signal into the first logic level.

12. The multiple-phase switching circuit of claim 11 wherein the alternative signal generator comprises:
    a finite state machine for generating the plurality of alternative signals according to the switching signal; and
    a synchronizer coupled to the finite state machine, for receiving the alternative signals and synchronously outputting the alternative signals.

13. The multiple-phase switching circuit of claim 12 wherein the synchronizer synchronously outputs the alternative signals according to the target clock signal.

14. The multiple-phase switching circuit of claim 12 wherein the synchronizer comprises a plurality of D-type flip-flops.

15. The multiple-phase switching circuit of claim 11 wherein the multiplexer comprises:
- a plurality of phase switching units for receiving the plurality of input clock signals and outputting a plurality of output signals according to the alternative signals; and
- a gate processor coupled to the phase switching units, for receiving the output signals and outputting the target clock signal.

16. The multiple-phase switching circuit of claim 15 wherein each phase switching unit receives one of the alternative signals and at least one of the clock signals.

17. The multiple-phase switching circuit of claim 15 wherein the gate processor is either an OR gate processor or a NOR gate processor.

18. The multiple-phase switching circuit of claim 11 wherein only one of the alternative signals generated by the alternative signal generator is in the first logic level, while the other alternative signals are in the second logic level.

19. The multiple-phase switching circuit of claim 11 wherein each clock signal corresponds to one of the alternative signals, and the multiplexer outputs the clock signal corresponding to the second alternative signal as the target clock signal.

20. The multiple-phase switching circuit of claim 11 wherein the multiple-phase switching circuit is used in a data recovery system or in a frequency synthesizer.

* * * * *